United States Patent
Deo

(10) Patent No.: US 9,548,707 B2
(45) Date of Patent: Jan. 17, 2017

(54) OUTPUT STAGE FOR NEAR RAIL OPERATION

(71) Applicant: Analog Devices, Inc., Norwood, MA (US)

(72) Inventor: Sukhjinder S. Deo, Wilsonville, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/620,135

(22) Filed: Feb. 11, 2015

(65) Prior Publication Data

US 2015/0236650 A1 Aug. 20, 2015

Related U.S. Application Data

(60) Provisional application No. 61/940,202, filed on Feb. 14, 2014.

(51) Int. Cl.
*H03F 1/02* (2006.01)
*G03F 3/04* (2006.01)
*H03F 3/45* (2006.01)

(52) U.S. Cl.
CPC . *H03F 3/45475* (2013.01); *H03F 2203/45528* (2013.01); *H03F 2203/45604* (2013.01); *H03F 2203/45694* (2013.01)

(58) Field of Classification Search
USPC .................................................. 330/288, 277
See application file for complete search history.

(56) References Cited

U.S. PATENT DOCUMENTS

| | | | |
|---|---|---|---|
| 6,104,244 A | 8/2000 | Gilbert | |
| 6,194,886 B1 | 2/2001 | D'Aquino et al. | |
| 7,081,797 B1 | 7/2006 | Bowers | |
| 8,319,552 B1 | 11/2012 | Gilbert | |
| 2014/0266444 A1* | 9/2014 | Scott | H03F 1/0227 330/257 |

* cited by examiner

*Primary Examiner* — Hieu Nguyen
(74) *Attorney, Agent, or Firm* — Knobbe, Martens, Olson & Bear, LLP

(57) ABSTRACT

Apparatus and method for an output stage of an amplifier are disclosed. A current source circuit provides current to a transistor connected to the amplifier output node to produce output voltage, and the current source circuit has two current mirror paths, one of which replicates the output voltage at the output node. As the output voltage approaches rail, more current is steered to the current mirror path not replicating the output voltage and provides additional current or voltage necessary to keep the current source circuit operational.

20 Claims, 7 Drawing Sheets

OUTPUT STAGE FOR NEAR RAIL OPERATION

CROSS-REFERENCE TO RELATED APPLICATION

This application claims the benefit under 35 U.S.C. §119 (e) of U.S. Provisional Application No. 61/940,202, filed Feb. 14, 2014, the entirety of which is hereby incorporated by reference.

BACKGROUND

Field

The invention generally relates to electronics, and in particular, to output stage of an amplifier.

Description of the Related Art

An output stage is commonly configured to deliver the output of a system, such as an amplifier, a measurement or control device or another functional block in an electrical system. Some considerations in designing an output stage include introduction of distortion, ability to drive the expected load from the following stage in the signal chain, relatively low power consumption, and ability to deliver an output signal as close to the supply rails as possible.

Some of these requirements can be more relaxed or stringent depending upon the particulars of a system. One of the challenging requirements in a measurement system such as an RF detector, is that the output voltage should be scaled with well-defined scaling parameters, so that the output voltage is as true of an indication of the signal being measured as possible. Reducing the number of scaling parameters can be helpful in achieving such a goal. In case of voltage input and output signals, a simple scaling parameter such as a resistor-ratio can be important in the translation from the input to the output. One of the requirements that a system can place on an output stage includes allowing the output voltage to swing to a supply rail, such as zero-volts, when no signal is present at the input. For a relatively small input signal, such as a few millivolts, the output should accurately produce a small output voltage as well.

Unlike system with multiple power supplies, in a single supply system, it can be challenging to have the output working range be as close to zero-volts as possible. While the output voltage can be shifted up by adding an output pedestal voltage, that introduces an additional scaling parameter which defines the pedestal voltage. The accuracy of this new scaling parameter may affect the accuracy of the overall output, especially near the bottom end of the range, where signal to be measured might itself be just a few millivolts.

Therefore an output stage that accurately produces an output voltage close to ground can be desirable for such a system.

SUMMARY

Each of the methods and devices of the described technology has several aspects, no single one of which is solely responsible for its desirable attributes.

One embodiment includes an apparatus comprising a current source transistor configured as a current source for an output node of an amplifier, a second transistor configured to generate a bias for the current source transistor, wherein the second transistor and the current source transistor are arranged in a current mirror, a current source configured to provide current to a first node, wherein the first node is electrically connected to at least a first path and a second path, wherein the first path includes the second transistor, and a replica circuit configured to replicate conditions of an output circuit, wherein the output circuit includes the current source transistor, wherein the second path includes the replica circuit.

Another embodiment includes a method for outputting voltage comprising sinking current from an output node of an amplifier with a current source transistor, generating a bias for the current source transistor with a second transistor, wherein the second transistor and the current source transistor are arranged in a current mirror, providing current to a first node with a current source, wherein the first node is electrically connected to at least a first path and a second path, wherein the first path includes the second transistor, and replicating conditions of an output circuit, wherein the output circuit includes the current source transistor, wherein the second path includes the replica circuit.

Another embodiment includes an apparatus comprising a means for sourcing current to an output node of an amplifier with a current source device, a means for generating a bias for the current source device with a second device, wherein the second device and the current source device are arranged in a current mirror, a means for providing current to a first node with a current source, wherein the first node is electrically connected to at least a first path and a second path, wherein the first path includes the second device, and a means for replicating conditions of an output circuit, wherein the output circuit includes the current source device, wherein the second path includes the replica circuit.

BRIEF DESCRIPTION OF THE DRAWINGS

These drawings and the associated description herein are provided to illustrate embodiments of the invention and are not intended to be limiting.

DETAILED DESCRIPTION

Figure 1A:
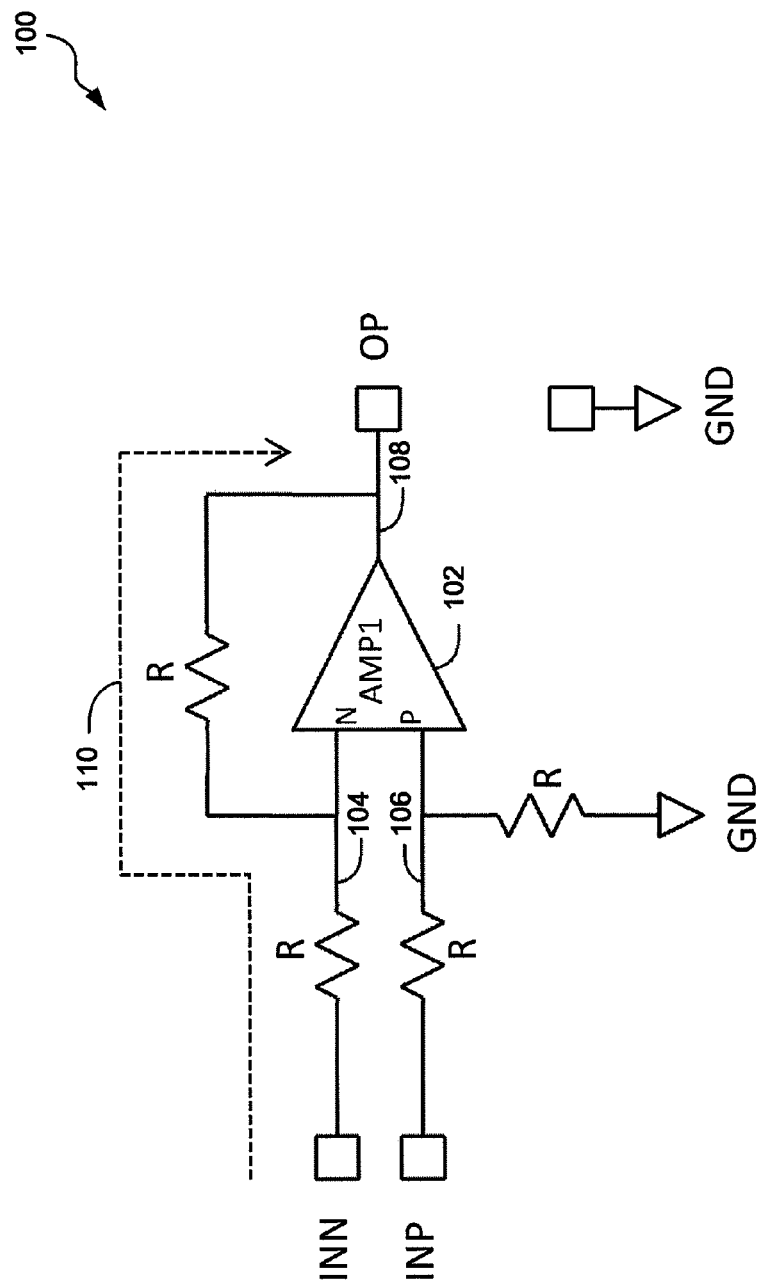
FIG. 1A is an illustration of an example use of an amplifier.

Various aspects of the novel systems, apparatuses, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to cover such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wired and wireless technologies, system configurations, networks, including optical networks, hard disks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Various embodiments will now be described in the context of bipolar junction transistors (BJTs). However, other types of transistors, such as insulated-gate transistors, can alternatively be used. While an insulated-gate transistor will typically not have a base current, many of the principles and advantages described herein will still be applicable. An example of an insulated-gate transistor is a metal-oxide-semiconductor field-effect transistor (MOSFET). For example, NMOS and PMOS transistors can be used for NPN and PNP transistors, respectively, with a gate, a drain, and a source substituting for a base, a collector, and an emitter, respectively. The relationship between voltages and currents of certain type of devices may render certain devices benefit from certain features of the disclosed herein to a greater or lesser degree, and a person of ordinary skill in the art may implement the disclosure herein with various devices as appropriate. While the terms "metal" and "oxide" are present in the name of the device, it will be understood that these transistors can have gates made out of materials other than metals, such as polycrystalline silicon, and can have dielectric "oxide" regions made from dielectrics other than silicon oxide, such as from silicon nitride or high-k dielectrics. In another embodiment, the devices illustrated herein may be implemented with other devices on silicon, compound semiconductor, or any other suitable semiconductor. In addition, while the various embodiments provide near rail operation to a lower voltage rail, the mirror images of the illustrated circuits can also be used to provide near rail operation to a higher voltage rail. Such a mirror image circuit can be constructed by swapping NPN and PNP transistors (or NMOS and PMOS), swapping VPOS and GND rails, and reversing current directions.

Embodiments of an output stage that allow the output to get down to about 2 mV, with moderate size transistors, capable of bandwidth in excess of 100 MHz at less than 0.5 mA current are disclosed herein. With proper selection of transistor sizes and bias current, trade-offs between bandwidth and power consumption can be accomplished by one of ordinary skill in the art, allowing for higher bandwidth or lower power consumption, to meet different system requirements.

Apparatus and method for an output stage of an amplifier are disclosed. A current source circuit may provide current to a transistor connected to an output node to produce amplifier output voltage, and the current source circuit may have two current mirror paths, one of which replicates the voltage of the output node. As the output voltage approaches rail, more current may be steered to the current mirror path not replicating the output voltage and can provide additional current or voltage used to keep the current source circuit operational.

FIG. 1A is an illustration of an example use of an amplifier. The illustrated circuit 100 includes an amplifier (AMP1) 102 having a negative input node (N) 104, a positive input node (P) 106, and an output node (OP) 108. The amplifier 102 illustrated in FIG. 1A may comprise a differential amplifier, which receives inverting input INN, and noninverting input INP with nominal reference to a common mode, which can be at mid-rail, e.g., (VPOS+GND)/2. The high rail voltage VPOS is illustrated in FIGS. 1B-2C. The amplifier 102 may translate the difference between the inverting input and the noninverting input to an output value at the output node 108 with reference to ground, GND. This mode of operation may allow maintaining the nominal mid-supply common-mode level for a preceding stage for ease of signal processing, for example. When both the inverting and noninverting inputs are at the common mode, i.e., the difference between the inverting and noninverting inputs is zero, the desired output at the output node 108 of the amplifier 102 should be 0V. In this example, current 110 flowing from the inverting input INN to the output node OP 108 would be the difference between the common mode voltage and the voltage at the output node 108 divided by 2×R. An output stage of the amplifier 102 can be designed to absorb the current 110 for this operation of the amplifier 102. Various implementations of the output stage of the amplifier 102 are discussed later in connection with FIGS. 1B-2C.

Figure 1B:
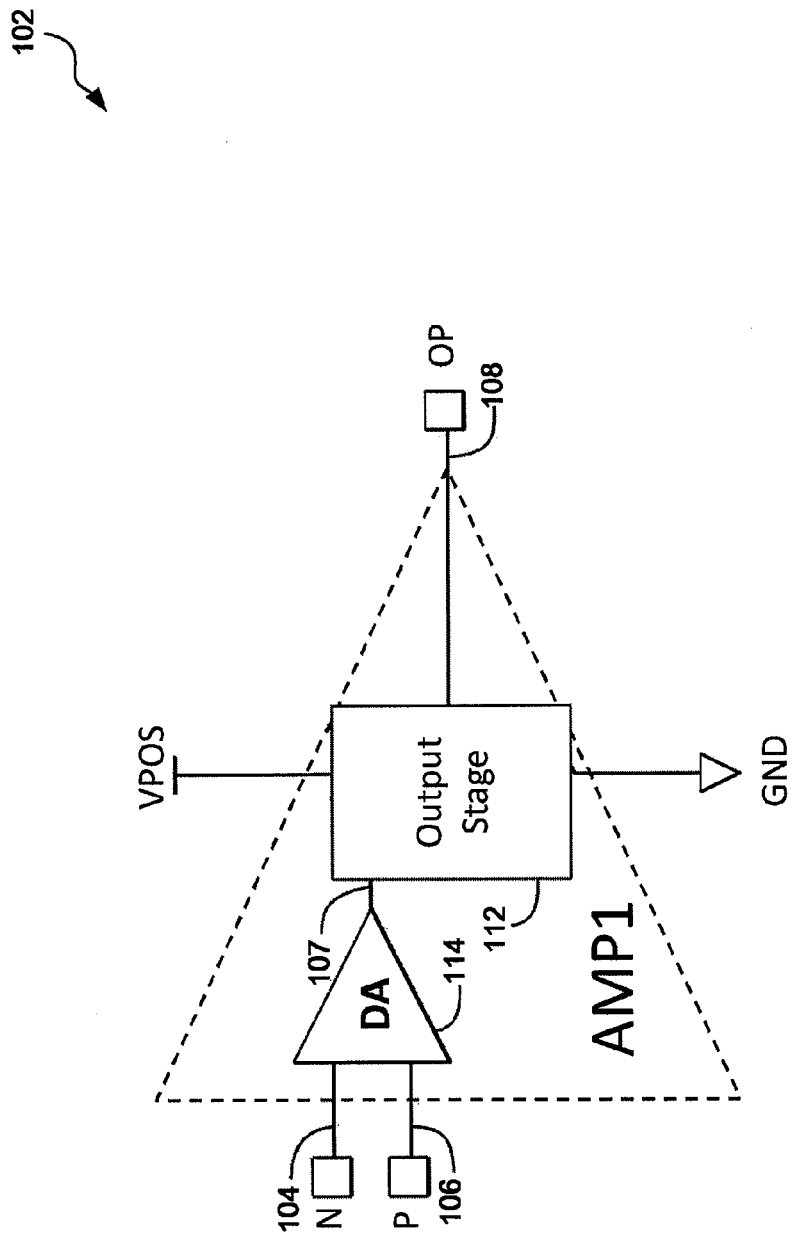
FIG. 1B is an illustration of the amplifier of FIG. 1A having a differential amplifier and an output stage.

FIG. 1B is an illustration of the amplifier 102 of FIG. 1A having a differential amplifier and an output stage. The amplifier 102 of FIG. 1A comprises a differential amplifier, DA, 114, a differential amplifier output 107, and an output stage 112. As discussed above, the current 110 (FIG. 1A) flowing from the inverting input to the output node 108 of the amplifier 102 can be absorbed by the output stage 112 of the amplifier 102. The differential amplifier 114 in FIGS. 1B-2C can correspond to an operational amplifier or to a portion of an operational amplifier except for an output stage, which can correspond to the rest of the circuits of FIGS. 2A-2C. In one example, an amplifier or operational amplifier can be provided in an integrated circuit using the input nodes 104, 106, and the output node 108. As further discussed in connection with FIGS. 2A-2C, due to operational constraints of devices included in the output stage 112, absorbing the current 110 (FIG. 1A) to produce near ground output voltage at the output node 108 can be challenging.

Figure 2A:
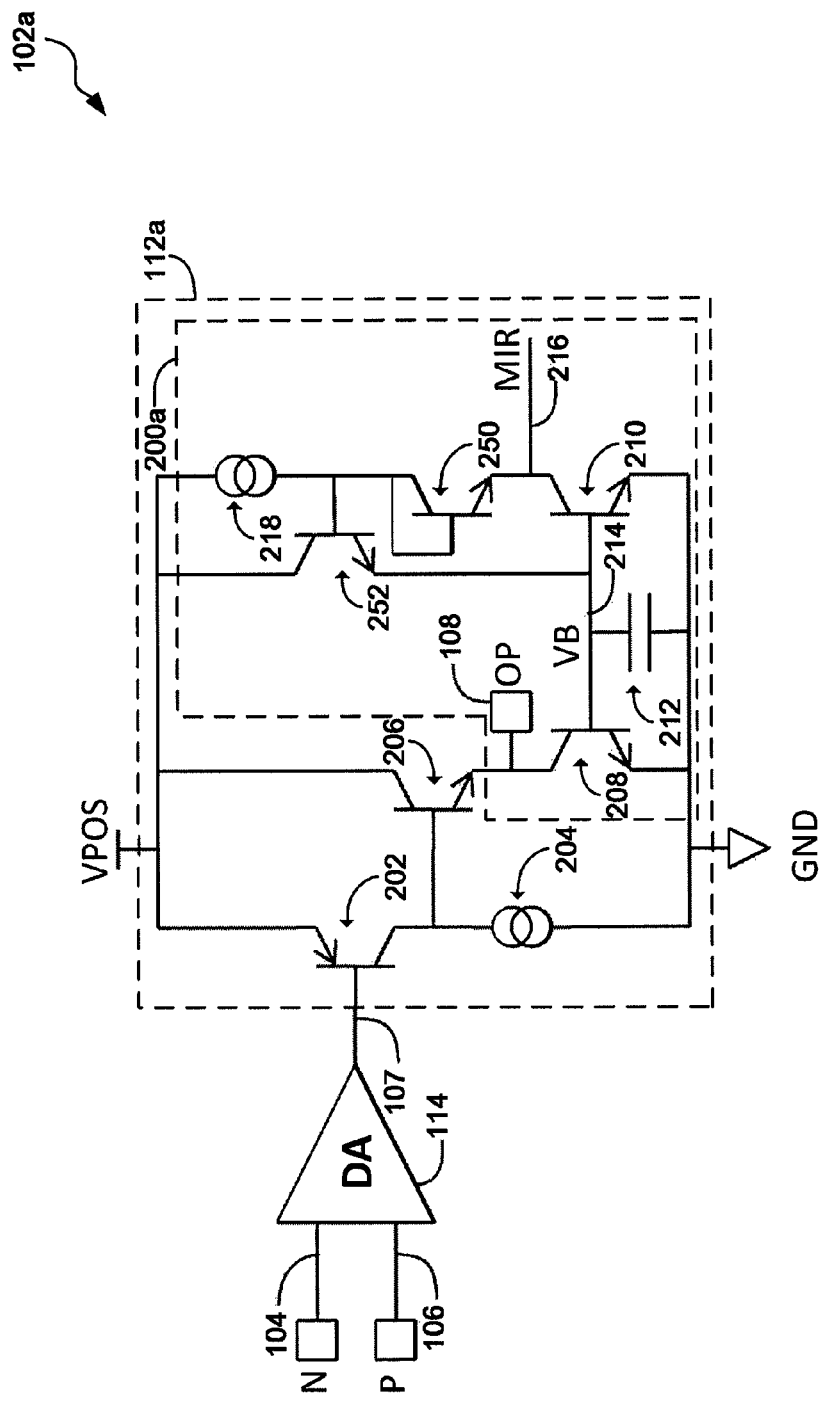
FIG. 2A is a circuit diagram of the amplifier of FIG. 1B including an example output stage.

FIG. 2A is a circuit diagram of the amplifier of FIG. 1B including an example output stage. The illustrated amplifier 102a includes an output stage 112a in prior art. The output stage 112a includes a common emitter transistor 202 connected to the differential amplifier output 107, and the common emitter transistor 202 is biased with a current source 204. The output stage 112a further includes an emitter follower transistor 206 and a current source circuit 200a, which are connected to the output node 108. The current source circuit 200a includes a current source transistor 208 and a transistor 210 forming a current mirror as the current through the transistor 210 provided by a current source 218, mirrored at the current source transistor 208. In some embodiments, the current source 218 may provide about 400 μA of current, but other amounts of current will also be applicable. The base of the current course transistor 208, or a base node 214, is further connected to a capacitor 212 to absorb negative base charge flow as the transistors 208, 210 come out of saturation during low to high input step, for example. In some embodiments, the capacitor 212 may be around 8-10 pF. However, other values of capacitance can be used as will be readily determined by one of ordinary skill in the art. The transistor 210 is further connected to a diode-connected transistor 250 and a beta-helper transistor 252. The output stage 112a may allow the bandwidth of the amplifier 102a be stable as the current source 204 maintains constant current in the common emitter transistor 202. As further discussed below, the diode-connected transistor 250 and the beta-helper transistor 252 may mitigate certain conditions of a current source circuit implemented with a simple current mirror without the transistors 250, 252.

For example, as the differential amplifier output 107, and in turn the voltage at the output node 108 (i.e., VCE of the current source transistor 208), approaches zero, the current source transistor 208 saturates and draws more base current. Without the beta-helper transistor 252, this extra base current needed by the current source transistor 208 diverts the current supplied by the current source 218 away from the transistor 210, reducing the collector current of the transistor 210. Instead, the beta-helper transistor 252 connected as an emitter follower as illustrated in FIG. 2A can supply extra base current to the current mirror formed by the transistors 208, 210. Also, the diode-connected transistor 250 may keep the collector current of the transistor 210 constant and thus keep VCE of the transistor 210 at near a constant base-emitter voltage (VBE), thereby reducing the difference in VCEs of the transistors 208 and 210 even as the current source transistor 208 saturates, improving the current mirror functionality.

However, even with the beta-helper transistor 252 and the diode-connected transistor 250, the rail to rail operation of the prior art output stage 112a is limited because the base voltage (VB) of the current source transistor 208 in FIG. 2A still depends on VBE of the transistor 210 that is unsaturated and running at a fixed current from the current source 218. As the VCE of the current source transistor 208 approaches zero, the large base current that the current source transistor 208 draws can create a noticeable voltage drop across the intrinsic base resistance of the current source transistor 208. This voltage drop across the intrinsic base resistance of the current source transistor 208 reduces the effective VBE of the current source transistor 208 as compared to VBE of the transistor 210, resulting in a drop in the output current of the current source transistor 208. As the output current of the current source transistor 208 drops to the current 110 (FIG. 1A), the output stage 112a no longer can absorb the current 110 (FIG. 1A) rendering an amplifier circuit including the amplifier 102a such as the circuit 100 (FIG. 1A) open loop and not function as configured.

As further discussed below in connection with FIGS. 2B-2C, the embodiments disclosed herein comprises an additional path connected to the current source 218 to steer current as the current source transistor 208 becomes saturated.

Figure 2B:
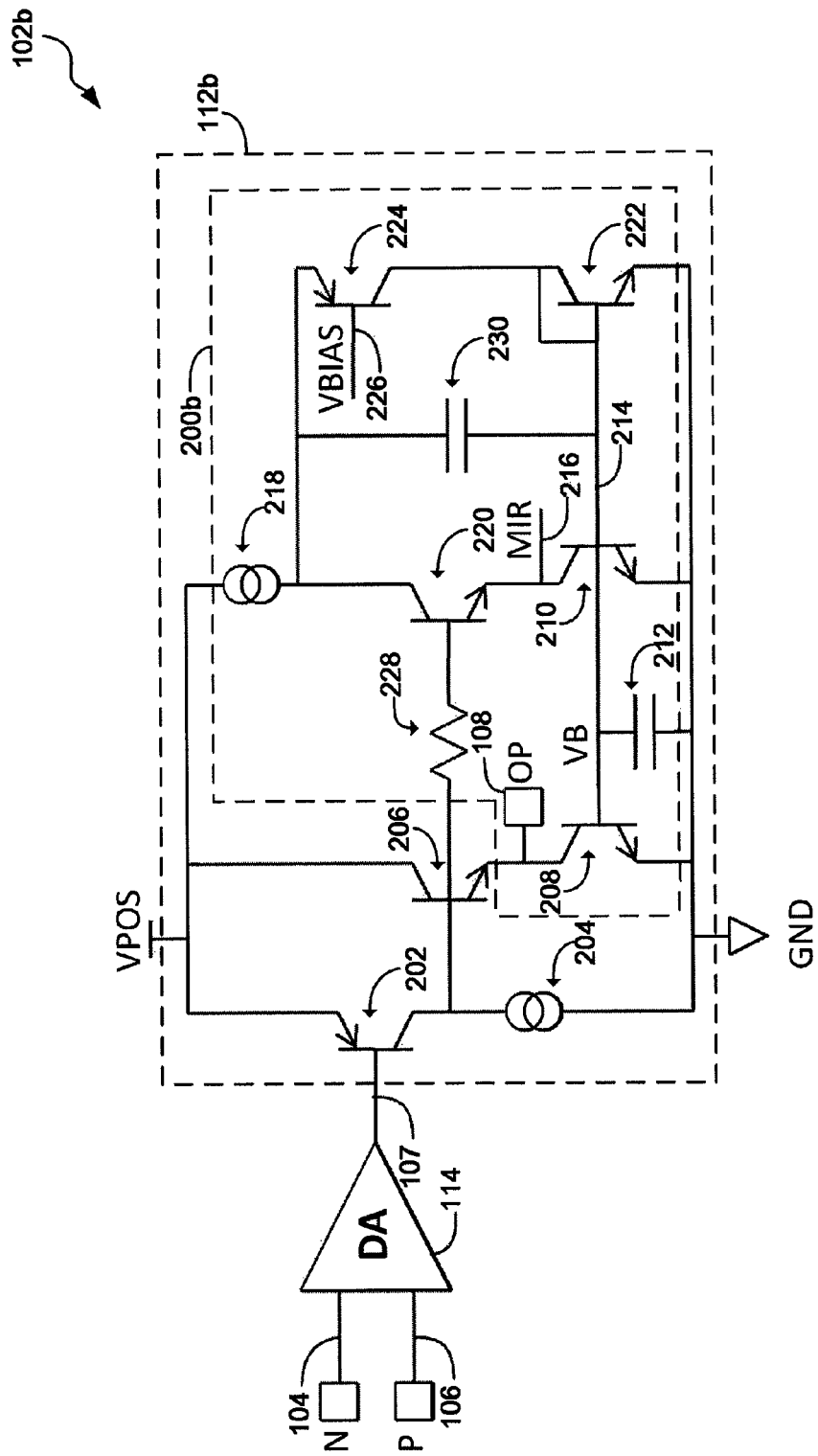
FIG. 2B is a circuit diagram of the amplifier of FIG. 1B including an example output stage according to one embodiment.

FIG. 2B is a circuit diagram of the amplifier of FIG. 1B including an example output stage according to one embodiment. The illustrated amplifier 102b includes an output stage 112b having the common emitter transistor 202, the current source 204, and the emitter follower transistor 206 similar to the amplifier 102a (FIG. 2A). However, the output stage 112b includes an isolation resistor 228, and the emitter follower transistor 206 is biased with a current source circuit 200b, which includes different elements to the current source circuit 200a of FIG. 2A. The current source circuit 200b includes the current source transistor 208, the capacitor 212, the transistor 210, and the current source 218 discussed above in connection with FIG. 2A. However, the current source circuit 200b further includes a cascode transistor, 220, a current mirroring path including transistors 224 and 224, and a frequency compensation capacitor 230. The transistor 220 can act as a cascode device to the transistor 210 and form a replica bias for the output transistor 206, with the mirror node (MIR) 216, tracking the voltage at the output node 108 for accurate current mirroring between transistors 210 and 208. The transistor 224 is biased with a bias voltage (VBIAS) at its base 226. During non-near-rail operations, the transistors 208, 210, and 222 may form a current mirror, but during near rail operations, the two paths formed by the transistors 220 and 224 connected to the current source 218 may adaptively steer current instead of mirroring as further discussed below. As used herein, the term "current source" applies to both sinks and sources of current, and whether a current source sinks or sources current can be determined by one of ordinary skill in the art by context.

As mentioned above, the current source circuit 200b includes two paths from the current source 218. The first path includes the current buffer transistor 224 and the transistor 222, which is diode-connected, and the second path includes the current buffer 220 and the transistor 210. The current through the first path (i.e., the current buffer transistor 224 and the transistor 222) can supply base current for the transistors 208, 210. When the output voltage at the output node 108 is not near rail (e.g., not near zero in this example) so that the transistors 208, 210 are not saturated, the current from the current source 218 may be proportionally split into the two paths and proportionally mirrored in accordance with the respective device sizing ratios or scale between the current source transistor 208 and the transistors 222 and 210. This proportional current mirroring by the current source circuit 200b may set the final base current of the current source device 208. For example, in some embodiments, the transistor 222 may be sized to have a smaller emitter area than the transistor 210 to reduce the severity of the base current drop of the current source device 208 as further discussed below. In other embodiments, the transistor 210 may be sized to have a smaller emitter area than the current source transistor 208 to reduce the current to be provided by the current source 218.

In the output stage 112b of FIG. 2B, the current buffer 220 may keep the VCE of the transistor 210 (i.e., the voltage at the mirror output node 216 of the replica circuit) to closely follow the VCE of the current source transistor 208 (i.e., the output voltage at the output node 108) even when the current source transistor 208 becomes saturated as extra base current can be supplied through steering current from the second path to the first path as disclosed herein. In contrast, in the output stage 112a of FIG. 2A, the VCE of the transistor 210 (FIG. 2A) does not follow the VCE of the current source transistor 208 (FIG. 2A). For near rail operation, the current source transistor 208 (FIG. 2A) goes into the saturation region, which uses more base current. However, the internal base resistance of the current source transistor 208 (FIG. 2A) causes a voltage drop which increases with the base current, making it difficult to drive the current source transistor 208 into saturation.

Returning now to FIG. 2B, in the output stage 112b of FIG. 2B, as the output voltage at the output node 108 approaches near-rail, the transistors 208 (FIG. 2B) and 210 (FIG. 2B) get saturated together rather than only the current source transistor 208 (FIG. 2A) being saturated in the configuration of FIG. 2A.

When the output voltage at the output node 108 is near rail (e.g., near zero in this example), both of the transistors 208, 210 can be saturated and draw relatively more base current and use higher voltage (VB) at the base node 214 as the voltage drop across the internal base resistance of the transistors 208, 210 increases with the increased base current. The current from the current source 218 is split into a first path (including the transistor 222) and to a second path (including the transistor 210). As the transistor 220 become cutoff, the current that ordinarily would flow in the second path (including the transistor 210) is steered to the first path (including the transistor 222), which increases the current flow for biasing the bases of the transistors 222, 208. As more current is steered to the first path having the transistor 222, more base current can be supplied to the transistors 208, 210, now operating in the saturation region, and the voltage at the base node VB 214 can be raised with the increased current to the diode-connected transistor 222. An example illustration of the increase in the voltage at the base node 214 is further discussed in connection with FIG. 4C below. Providing more base current to the transistor 208 and raising the base node VB 214 voltage can drive the transistor 208 deeper into the saturation region and may allow the current source circuit 200b and in turn, the output stage 112b to better handle output voltages at the output node 108 that are desired to be relatively close to the rail voltage. For example, in some embodiments, the output stage 112b may be operational down to 2 mV of output voltage in modern process with proper choice of device sizes and bias currents. Example illustrations of these improved functionalities are further illustrated in and discussed in connection with FIGS. 3-4C below.

While the transistor 208 may have relatively less collector current under saturation conditions compared to that under unsaturated conditions, the current drive near the rail provided by the transistor 208 for the configuration of FIG. 2B is still superior than the current drive for the configuration of FIG. 2A. Furthermore, by sizing the emitter area of the transistor 222 smaller than that of the transistor 210, a smaller fraction of the current flows in the first path (having the transistor 222) than the second path (having the transistor 210) such that current steering affects the first path to a greater proportional extent than the second path. Thus, steering current away from the second path impacts the second path not so severely while steering the same current to the first path benefits the functionality of the current source circuit 200b to a greater extent.

Still referring to FIG. 2B, the isolation resistor 228 can be placed between the bases of the emitter follower transistor 206 and the current buffer 220. The isolation resistor 228 may isolate the dynamics of the differential amplifier 114 and the transistors 202, 206 from the dynamics of the current source circuit 200b. The isolation resister 228 may improve the operation of the output stage 112b when it operates while the transistors 208, 210 are in saturation as the output voltage at the output node 108 approaches rail (e.g., zero).

When the transistor 210 is saturated, its output impedance may be significantly lowered so that the transistor 220 may act as a degenerated common emitter rather than a common base of a cascode. Acting as a degenerated common emitter, the transistor 220 may allow perturbation at its base to enter into the current source circuit 200b. The isolation resistor 228 may provide isolation desirable in this mode of operation. The isolation resistor 228 can be selected to have the order of magnitude of 2-10 kΩ, for example. The frequency compensation capacitor 230 may be connected between the emitter of the transistor 224 and the base node 214. In other embodiments, frequency compensation may be achieved with one or more of other circuit elements at different locations within the amplifier circuit 100. The value of the frequency compensation capacitor 230 or any other method of frequency compensation may be chosen by a person of ordinary skill in the art based on various considerations of the amplifier circuit 100 such as the desired gain roll-off and phase shift.

Figure 2C:
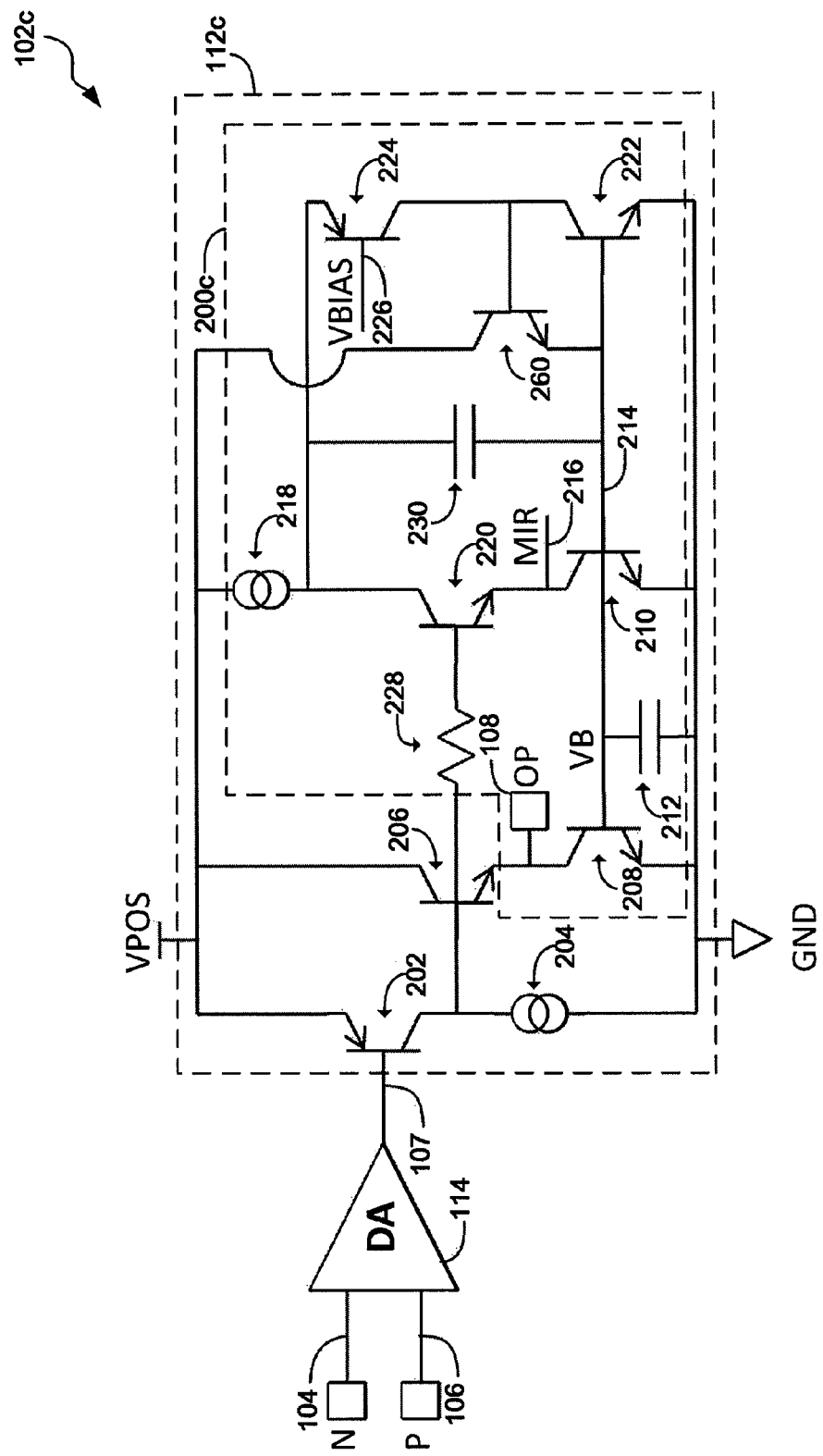
FIG. 2C is a circuit diagram of the amplifier of FIG. 1B including an example output stage according to another embodiment.

FIG. 2C is a circuit diagram of the amplifier of FIG. 1B including an example output stage according to another embodiment. The illustrated amplifier 102c includes an output stage 112c having the common emitter transistor 202, the current source 204, and the emitter follower transistor 206 similar to the amplifier 102b (FIG. 2B). Also, the amplifier 102c includes a current source circuit 200c, which includes the current source transistor 208, the capacitors 212, 230, the current source 218, the isolation resistor 228, the current buffer transistors 220, 224, and the transistors 210, 222 similar to the current source circuit 200b (FIG. 2B). In addition to similar elements discussed above, the output stage 112c also includes a beta helper transistor 260 and has the transistor 222 not diode-connected. The beta helper transistor 260 can provide base current in addition to the current supplied by the current source 218, which can be a fixed current source. The beta helper transistor 260 may assist keeping the output current of the current source transistor 208 stable under saturation conditions. Although the same numberings of elements in FIGS. 2B and 2C may indicate corresponding features of the embodiments described in connection with FIGS. 2A-2C, devices of the same numberings may not be identical as a person of ordinary skill in the art may make various design choices as appropriate for particular goals or performance constraints. For example, as a person of ordinary skill in the art may make appropriate choice of device sizes of the various embodiments described herein, the disclosed circuit may provide an output swing that can go down to sub-millivolt levels while keeping the current source circuit working. Further details of example performances are discussed in connection with FIGS. 3-4C below.

Figure 3:
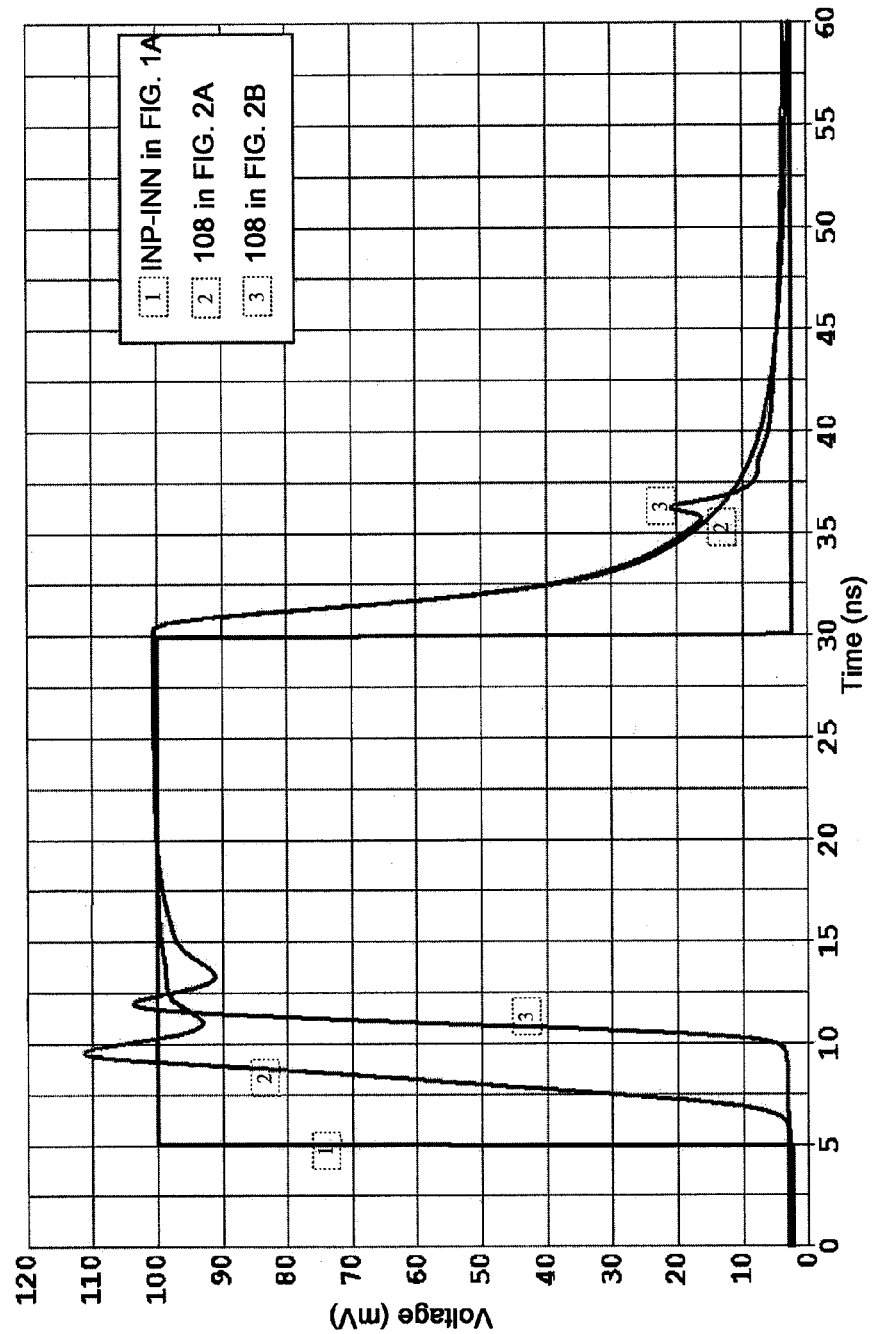
FIG. 3 is a graph illustrating example step responses of the circuits in FIGS. 2A and 2B.

FIG. 3 is a graph illustrating example step response comparison between the circuits in FIGS. 2A and 2B. The illustrated graph shows time in nanoseconds on its x-axis, and input and output voltages in millivolts on its y-axis. The first plot shows the applied differential step voltage at the input of the differential amplifier of FIG. 1A. The second and third plots show responses to the step input of the output stage 112a and 112b respectively. In this example, the first plot is an input step from 2.5 mV to 100 mV, and the differential amplifier gain is set to unity. As illustrated the response time of the voltage at the output node 108 of FIG. 2B is shorter than that of the voltage at the output node 108 of FIG. 2A as the output stage 112b of FIG. 2B can absorb the current 110 (FIG. 1A) at a lower output voltage level, improving the step response.

Figure 4A:
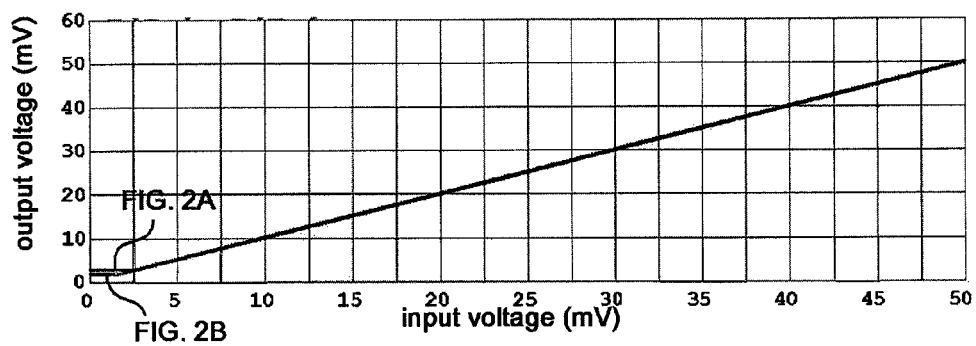
FIG. 4A is a graph illustrating example output voltages of the circuits in FIGS. 2A and 2B.

FIG. 4A is a graph illustrating example output voltages of the circuits in FIGS. 2A and 2B. The illustrated graph has input voltage in millivolts on its x-axis and output voltage in millivolts on its y-axis. As indicated in FIG. 4A, the output voltage at the output node 108 of FIG. 2B can go closer to the rail (zero in this example).

Figure 4B:
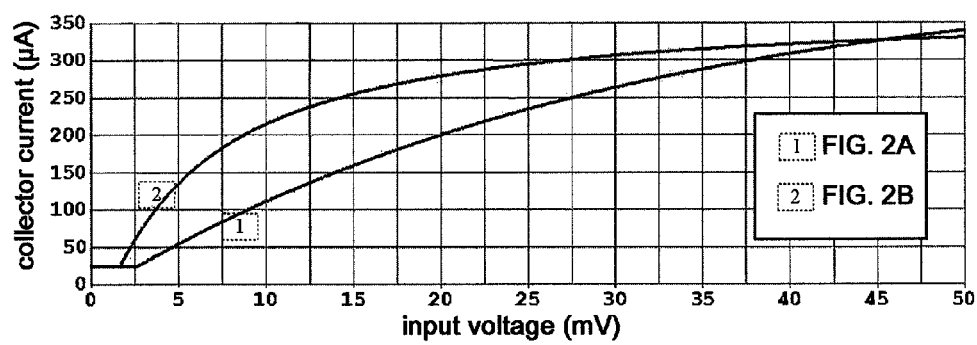
FIG. 4B is a graph illustrating example collector currents of the circuits in FIGS. 2A and 2B.

FIG. 4B is a graph illustrating example collector current of the current source transistor 208 of the circuits in FIGS. 2A and 2B. The illustrated graph has input voltage in millivolts on its x-axis and collector current of the current source transistor 208 in micro amps. As discussed above in connection with FIGS. 2A-2C, the collector current of the current source transistor 208 may correspond to the output current of the current source circuit 200a, 200b, or 200c that biases the emitter follower transistor 206 to generate an output at the output node 108. As shown in the graph of FIG. 4B the current source circuit of FIG. 2B can generate greater current over a greater range of input voltage as it approaches rail (or decreases to zero, in this example). Furthermore, the first plot (FIG. 2A) shows that the output stage 112a stops being operational at around 2.5 mV of input voltage whereas the second plot (FIG. 2B) shows that the output stage 112b remains operational for a lower input voltage.

Figure 4C:
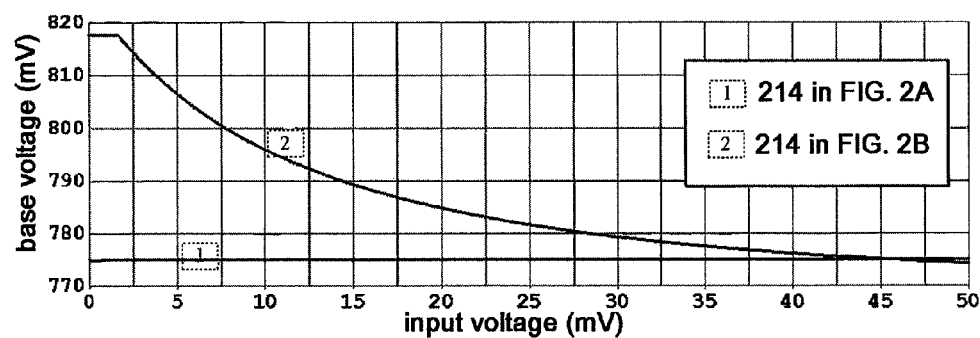
FIG. 4C is a graph illustrating example base voltages of the circuits in FIGS. 2A and 2B.

FIG. 4C is a graph illustrating example base voltages of the circuits in FIGS. 2A and 2B. The illustrated graph has input voltage in millivolts on its x-axis and the voltage at the base node 214 in millivolts on its y-axis. As discussed above in connection with FIGS. 2A-2C, the voltage at the base node 214 in FIG. 2A remains fixed depending on the unsaturated transistor 210 (FIG. 2A); on the other hand, the voltage at the base node 214 in FIGS. 2B-2C increases as more current is steered to the path including the transistor 222. In the illustrated example of FIG. 4C, the voltage at the base node 214 of FIG. 2A remains constant at around 775 mV as the input voltage approaches rail (zero in this example) while the voltage at the base node 214 of FIG. 2B increases to above 815 mV as the input voltage approaches zero.

The systems, apparatus, and/or methods discussed herein can be implemented in various electronic devices. Examples of the electronic devices can include, but are not limited to, consumer electronic products, parts of the consumer electronic products, electronic test equipment, wireless communications infrastructure such as base stations, automotive electronics, industrial electronics, etc. Examples of the electronic devices can also include memory chips, memory modules, circuits of optical networks or other communication networks, and disk driver circuits. The consumer electronic products can include, but are not limited to, measurement instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a wrist watch, a clock, etc. Further, the electronic device can include unfinished products.

Unless the context clearly requires otherwise, throughout the description and the clauses, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings provided herein can be applied to other apparatus, not necessarily the apparatus described above. The elements and acts of the various embodiments described above can be combined to provide further embodiments.

While certain embodiments have been described, these embodiments have been presented by way of example only, and are not intended to limit the scope of the disclosure. Indeed, the novel methods, apparatus, and systems described herein may be embodied in a variety of other forms. Furthermore, various omissions, substitutions and changes in the form of the methods and systems described herein may be made without departing from the spirit of the disclosure.

What is claimed is:

1. An apparatus comprising:
a current source transistor configured as a current source for an output node of an amplifier;
a second transistor configured to generate a bias for the current source transistor, wherein the second transistor and the current source transistor are arranged in a current mirror;
a current source configured to provide current to a first node, wherein the first node is electrically connected to at least a first path and a second path so as to provide biasing currents to the first path and the second path, wherein the first path includes the second transistor; and
a replica circuit configured to replicate conditions of an output circuit, wherein the output circuit includes the current source transistor, wherein the second path includes the replica circuit.

2. The apparatus of claim 1, wherein the second transistor is diode-connected.

3. The apparatus of claim 1, wherein the first and second paths are configured to steer current from the second path to the first path as the voltage at the output node approaches a rail voltage.

4. The apparatus of claim 3, wherein the rail voltage is zero volts.

5. The apparatus of claim 1, wherein the current source transistor, the second transistor, and the replica circuit comprise one or more bipolar junction transistors.

6. The apparatus of claim 1, wherein the replica circuit comprises a cascode transistor and a second mirroring transistor.

7. The apparatus of claim 6, wherein the second transistor is a diode connected transistor and the first path further comprises a second cascode transistor.

8. The apparatus of claim 6, further comprising an isolation device configured to isolate the cascode transistor from an emitter follower, wherein the emitter follower is connected to the output node.

9. The apparatus of claim 7, wherein the diode connected transistor is sized smaller than the second mirroring transistor.

10. The apparatus of claim 1, further comprising a beta-helper transistor.

11. The apparatus of claim 1, wherein the apparatus is frequency compensated.

12. A method for outputting voltage comprising:
sinking current from an output node of an amplifier with a current source transistor;
generating a bias for the current source transistor with a second transistor, wherein the second transistor and the current source transistor are arranged in a current mirror;
providing current to a first node with a current source, wherein the first node is electrically connected to at least a first path and a second path so as to provide biasing currents to the first path and the second path, wherein the first path includes the second transistor; and
replicating conditions of an output circuit, wherein the output circuit includes the current source transistor, wherein the second path includes the replica circuit.

13. The method of claim 12 further comprising steering current from the second path to the first path as a voltage at the output node approaches a rail voltage.

14. The method of claim 12, wherein the first path is configured to accept less current than the second path relative to the current provided to the output node.

15. The method of claim 12 further comprising compensating for high frequency with a capacitor.

16. The method of claim 12 further comprising providing current to the current source transistor with a beta-helper transistor.

17. An apparatus comprising:
a means for sourcing current to an output node of an amplifier with a current source device;
a means for generating a bias for the current source device with a second device, wherein the second device and the current source device are arranged in a current mirror;
a means for providing current to a first node with a current source, wherein the first node is electrically connected to at least a first path and a second path so as to provide biasing currents to the first path and the second path, wherein the first path includes the second device; and
a means for replicating conditions of an output circuit, wherein the output circuit includes the current source device, wherein the second path includes the replica circuit.

18. The apparatus of claim 17 further comprising a means for steering current from the second path to the first path as a voltage at the output node approaches a rail voltage.

19. The apparatus of claim 17 further comprising a means for isolating the means for replicating conditions of the output circuit and the means for generating a bias for the current source device.

20. The apparatus of claim 17 further comprising a means for frequency compensation.

* * * * *